United States Patent
Park et al.

(10) Patent No.: US 9,839,120 B2
(45) Date of Patent: Dec. 5, 2017

(54) WARPAGE-PREVENTING STRUCTURE OF SUBSTRATE

(71) Applicant: KCC CORPORATION, Seoul (KR)

(72) Inventors: Jun Hee Park, Jeonju-si (KR); Moon Su Han, Jeonju-si (KR); Na Ri Im, Iksan-si (KR)

(73) Assignee: KCC CORPORATION, Seoul (KR)

( * ) Notice: Subject to any disclaimer, the term of this patent is extended or adjusted under 35 U.S.C. 154(b) by 83 days.

(21) Appl. No.: 14/982,303

(22) Filed: Dec. 29, 2015

(65) Prior Publication Data

US 2016/0192476 A1 Jun. 30, 2016

(30) Foreign Application Priority Data

Dec. 29, 2014 (KR) .................. 10-2014-0192225

(51) Int. Cl.
*H05K 1/02* (2006.01)
*H05K 1/03* (2006.01)
*H01L 23/498* (2006.01)

(52) U.S. Cl.
CPC ..... *H05K 1/0271* (2013.01); *H01L 23/49838* (2013.01); *H05K 1/0306* (2013.01); *H01L 2924/0002* (2013.01); *H01L 2924/3511* (2013.01)

(58) Field of Classification Search
CPC ............. H05K 1/0271; H05K 1/0306; H01L 23/49838

USPC ......................................... 174/250
See application file for complete search history.

(56) References Cited

U.S. PATENT DOCUMENTS

| | | | | |
|---|---|---|---|---|
| 6,534,852 B1* | 3/2003 | Lin | ........ | H01L 24/48 257/690 |
| 2005/0062412 A1* | 3/2005 | Taniguchi | ........ | F21K 9/232 313/512 |
| 2012/0111610 A1* | 5/2012 | Kim | ........ | H01L 23/3735 174/252 |
| 2014/0115889 A1* | 5/2014 | Lin | ........ | H05K 3/4682 29/849 |

FOREIGN PATENT DOCUMENTS

| | | | | |
|---|---|---|---|---|
| CN | 102468250 A | * | 5/2012 | ........ H01L 23/3735 |
| JP | 2007-019123 A | * | 1/2007 | |
| JP | 2013077976 A | | 4/2013 | |
| KR | 101280250 B1 | | 7/2013 | |
| WO | WO 2011-111989 A2 | * | 9/2011 | |

* cited by examiner

*Primary Examiner* — Timothy Thompson
*Assistant Examiner* — Charles Pizzuto
(74) *Attorney, Agent, or Firm* — Lathrop Gage LLP

(57) ABSTRACT

The present invention relates to a warpage-preventing structure for reducing the warpage of the substrate itself, the warpage which results from the difference of the metal patterns of top and bottom surfaces, and/or the warpage which results from the difference in the thermal expansion coefficients of a metal pattern and the substrate, the warpage-preventing structure comprising at least one additional metal layer, wherein the at least one additional metal layer is disposed on at least one surface of the substrate and arranged along an edge of the substrate.

7 Claims, 3 Drawing Sheets

WARPAGE-PREVENTING STRUCTURE OF SUBSTRATE

TECHNICAL FIELD

The present invention relates to a warpage-preventing structure of a substrate, more particularly to a warpage-preventing structure for reducing the warpage of the substrate itself, the warpage which results from the difference in the metal patterns of top and bottom surfaces, and/or the warpage which results from the difference in the thermal expansion coefficients of a metal pattern and the substrate.

BACKGROUND ART

Conventionally, metal-bonded ceramic substrates, in which a metal such as copper (Cu) and aluminum (Al) is bonded to a substrate made from ceramic materials such as alumina ($Al_2O_3$), aluminium nitride (AlN), silicon carbide (SiC) and silicon nitride (Si3N4) have been widely used as components of semiconductor devices.

As a method for bonding a metal plate to a ceramic substrate, a direct bonding copper (DBC) method, in which—after a metal plate made from a metal such as copper is placed on a ceramic substrate—the copper plate is directly bonded to the substrate by heating the copper plate at a temperature which is lower than the melting point temperature (1083° C.) of copper and higher than the eutectic point temperature (1065° C.) of copper and oxygen, has been developed and commercially used. Recently, in order to maintain increase of heat emission and a mechanically strong bonding property, ceramic circuit substrates manufactured by an active metal method, in which metal-bonded circuit substrates are bonded through lead layers, have been developed and used in power semiconductors which demand high reliability.

Recently, metal-bonded ceramic substrates have been manufactured by a method of forming the desired circuit patterns by chemically etching a metal plate after the metal plate is bonded to a big ceramic substrate. This method can simultaneously manufacture many circuit substrates, and the manufactured circuit substrate is finally divided into individual substrates by a laser process using carbon dioxide.

The metal-bonded ceramic substrate manufactured by the above method is usually cut and separated into individual circuit substrates, and then a semiconductor-mounting process is performed. In order to increase productivity and work efficiency of the semiconductor-mounting process, a complex arranged substrate manufactured by a laser, not an individual substrate, has been developed. However, since such a complex arranged metal-bonded ceramic substrate is bigger than an individual circuit substrate, it tends to become warped due to its big size. Therefore, in an automation process for mass production, it is difficult to transfer the complex arranged metal-bonded ceramic substrate and fix it in a vacuum environment, and it is liable to be broken when loaded or delivered. Therefore, in order to resolve these problems, various researches for reducing warpage of the complex arranged metal-bonded ceramic substrate have taken place.

BACKGROUND ART DOCUMENTS

Korean Patent No. 10-1280250 (Jul. 5, 2013)
Japanese Patent Laid-open Publication No. 2011-216533 (Oct. 27, 2011)

DISCLOSURE

Technical Problem

To resolve the problems of the background arts as explained above, the present invention provides a warpage-preventing structure which can prevent or reduce the warpage of a substrate itself, the warpage resulting from the difference of the metal patterns of the top and bottom surfaces, and/or the warpage resulting from the difference between the thermal expansion coefficient of a metal pattern and that of a ceramic substrate by controlling the entire mass of an additional metal layer which is formed along the edge of the substrate.

The object of the present invention is not limited to the object mentioned above, and another object which is not mentioned above may be clearly understood by a skilled artisan from the following description.

Technical Solution

The present invention discloses a warpage-preventing structure for preventing warpage of a substrate, wherein at least one metal layer for circuit pattern is disposed on at least one surface of the substrate, the warpage-preventing structure comprising: at least one additional metal layer, wherein the at least one additional metal layer is disposed on at least one surface of the substrate and arranged along an edge of the substrate, wherein at least one additional metal layer pattern is formed on the at least one additional metal layer by removing at least one predetermined area of the at least one additional metal layer.

The at least one additional metal layer pattern is a plurality of additional metal layer patterns, which are removed to be spaced apart from each other.

The additional metal layers are formed on a first surface and a second surface of the substrate, and wherein the entire mass of the additional metal layer formed on the first surface of the substrate is different from the entire mass of the additional metal layer formed on the second surface of the substrate.

The ratio of the entire mass of the additional metal layer formed on the first surface to the entire mass of the additional metal layer formed on the second surface is 1:0.2 to 1:0.8.

For the substrate which is warped in such a way that the first surface of the substrate is convex, and the second surface of the substrate is concave, the entire mass of the additional metal layer formed on the first surface is set to be more than the entire mass of the additional metal layer formed on the second surface.

For the substrate which is warped along a first direction, the entire mass of the additional metal layer formed in the first direction of the substrate is set to be more than the entire mass of the additional metal layer formed in a second direction of the substrate, and wherein the second direction is perpendicular to the first direction.

The warpage-preventing structure further comprises at least one cutting line which is disposed between the at least one metal layer and the at least one additional metal layer.

Advantageous Effects

A warpage-preventing structure according to the present invention can prevent or reduce warpage of a metal-bonded substrate by forming an additional metal layer at the outside of a metal layer for circuit pattern which is bonded on at least one surface of a substrate such as a ceramic substrate, and by generating the difference between the entire mass of the additional metal layer formed on the top surface of the substrate and the entire mass of the additional metal layer formed on the bottom surface of the substrate or generating the difference between the entire mass of the additional metal layer disposed perpendicular to a warping direction and the entire mass of the additional metal layer disposed along the warping direction.

MODE FOR INVENTION

Hereinafter, a warpage-preventing structure according to the preferred embodiment of the present invention will be described in detail with reference to the accompanying drawings. The relevant publicly known functions or structures will not be explained in detail herein if they are not necessary to understand the gist of the present invention.

Figure 1:
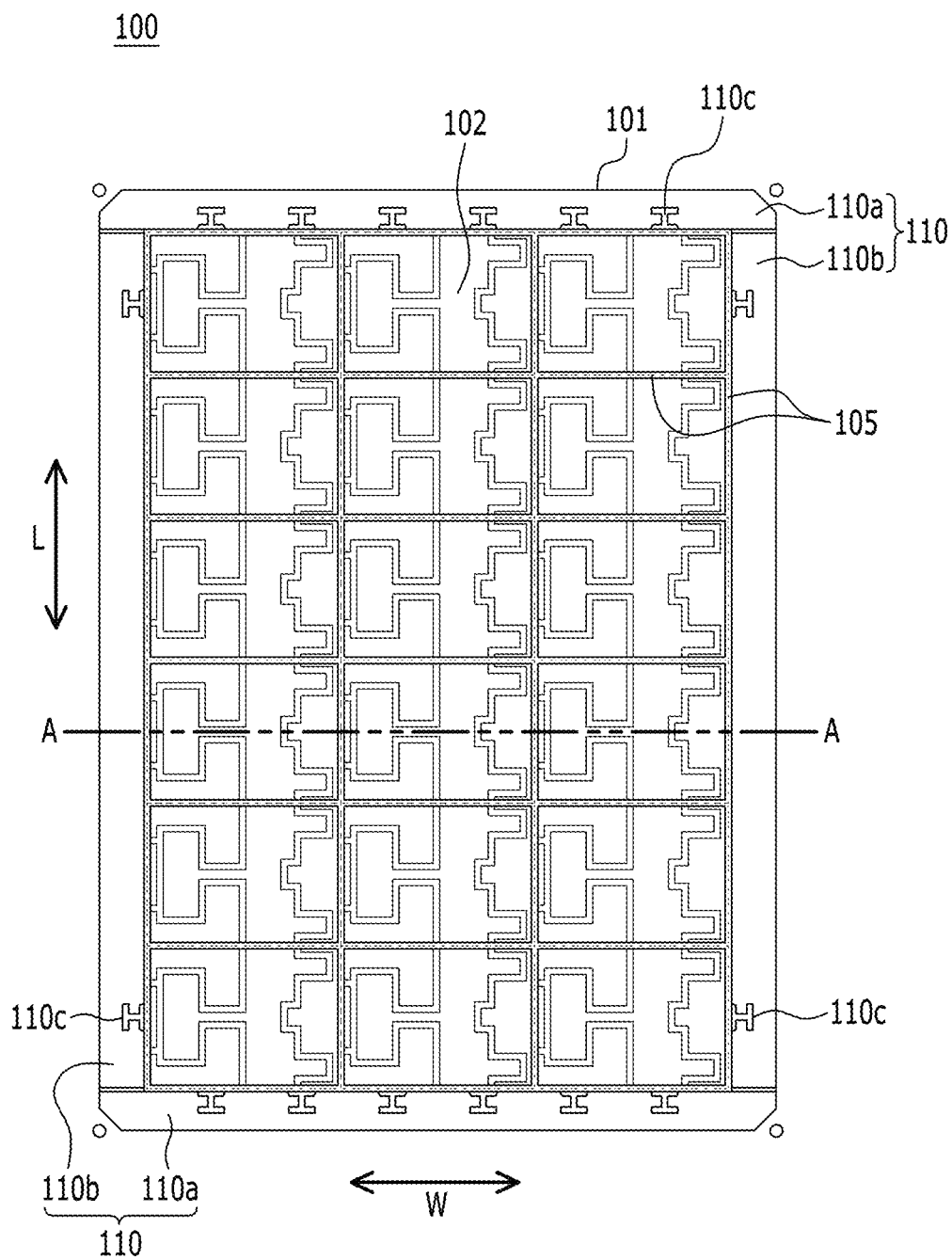
FIG. 1 is a top view illustrating the top surface of a warpage-preventing structure according to the preferred embodiment of the present invention.
Figure 2:
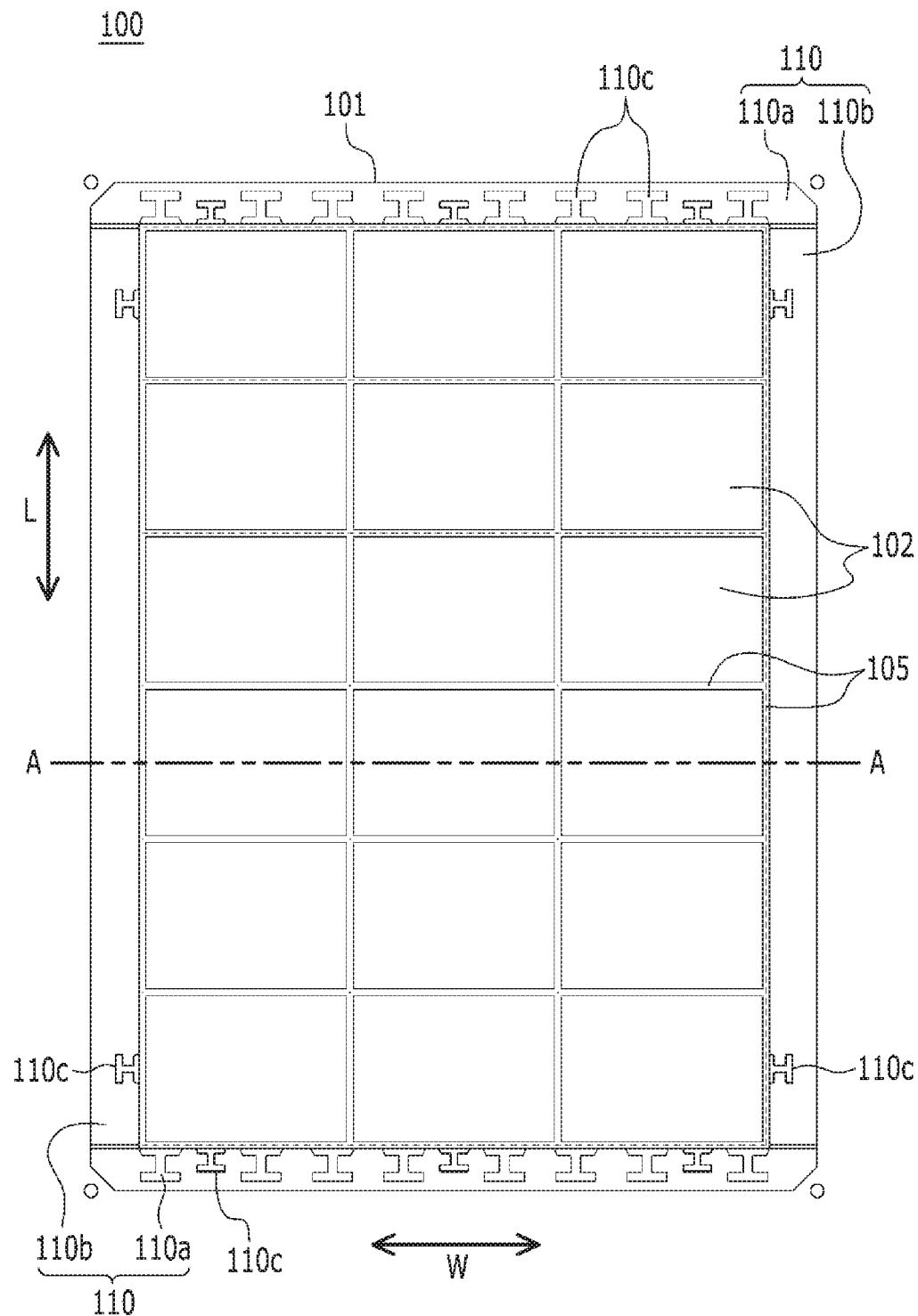
FIG. 2 is a bottom view illustrating the bottom surface of the warpage-preventing structure according to the preferred embodiment of the present invention.
Figure 3:
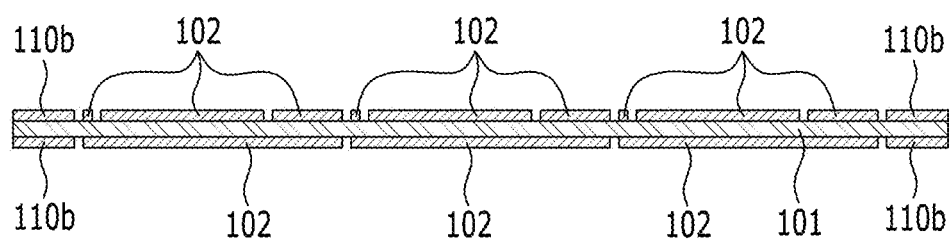
FIG. 3 is a sectional view according to line A-A of FIGS. 1 and 2.

FIG. 1 is a top view illustrating the top surface of a warpage-preventing structure according to the preferred embodiment of the present invention. FIG. 2 is a bottom view illustrating the bottom surface of the warpage-preventing structure according to the preferred embodiment of the present invention. FIG. 3 is a sectional view according to line A-A of FIGS. 1 and 2.

The warpage-preventing structure according to the preferred embodiment of the present invention is a structure for preventing or reducing warpage of a substrate 101, on which a metal layer for circuit pattern 102 is bonded, by arranging an additional metal layer 110.

The substrate 101 is plate-shaped and made from ceramic materials such as alumina ($Al_2O_3$), aluminium nitride (AlN), silicon carbide (SiC) and silicon nitride ($Si_3N_4$), but is not limited thereto. The substrate 101 may be warped due to its own weight.

The metal layer for circuit pattern 102 is bonded to the top surface and/or the bottom surface, and has a shape in which a plurality of circuit pattern areas are repeatedly arranged in horizontal and vertical directions over the entire substrate 101 (hereinafter, the metal layer for circuit pattern 102 is referred to as "metal layer 102," and the substrate 101 on which the metal layer 102 is formed is referred to as "metal-bonded substrate"). If the metal layers 102 are formed on the top and bottom surfaces of the substrate 101, the top surface pattern may be different from the bottom surface pattern as illustrated in FIGS. 1 and 2. In this case, the metal-bonded substrate may be warped due to the shape difference between the pattern of the metal layer 102 bonded to the top surface and the pattern of the metal layer 102 bonded to the bottom surfaces. Furthermore, the metal-bonded substrate may be warped due to the difference between the thermal expansion coefficient of the metal layer 102 and the thermal expansion coefficient of the substrate 101.

The metal layer 102 may be formed by a direct bonding copper (DBC) method, in which after a metal such as copper is placed on the substrate 101, the copper is directly bonded to the substrate 101 by heating the copper at a temperature which is lower than the melting point temperature (1086° C.) of copper and higher than the eutectic point temperature (1065° C.) of copper and oxygen.

The additional metal layer 110 is added to prevent warpage of the metal-bonded substrate. The additional metal layer 110 is not used in a semiconductor device but is used so as to increase strength of the metal-bonded substrate. The additional metal layer 110 is removed after the circuit pattern areas are cut from the metal-bonded substrate.

The additional metal layer 110 is formed along the edges of the top and/or bottom surfaces of the substrate 101 in the shape of a strap. The additional metal layers 110 are not included in the circuit patterns. The additional metal layer 110 may be continuously formed along the edges of the substrate 101. Furthermore, the additional metal layer 110a extended in a width direction and the additional metal layer 110b extended in a length direction, which are formed along the edges of the substrate 101, may be separated and spaced apart from each other.

Like the metal layer 102, the additional metal layer 110 may be made from metals such as copper. The additional metal layer 110 is spaced apart from the metal layer 102 and encloses the metal layer 102.

The additional metal layer pattern 110c is formed on the additional metal layer 110 by removing a predetermined area(s) of the additional metal layer 110. The additional metal layer pattern 110c may be formed by a chemical etching method.

Since the additional metal layer pattern 110c is formed by removing a predetermined area(s) of the additional metal layer 110, as the additional metal layer patterns 110c are further formed, the removed predetermined areas of the additional metal layer 110 are increased, and thus the entire mass of the additional metal layer 110 bonded to one surface of the substrate 101 is decreased. The warpage-preventing substrate according to the present invention can reduce warpage of the metal-bonded substrate by controlling the entire mass of the additional metal layer 110 bonded to one surface of the metal-bonded substrate.

The shape of the additional metal layer pattern 110c may be determined on the basis of the entire mass of the additional metal layer 110 to be removed. The additional metal layer pattern 110c may have a plurality of the removed predetermined areas spaced apart from each other and may have a plurality of the additional metal layer areas spaced apart from each other. The additional metal layer patterns 110c may be evenly distributed over the entire additional metal layer 110 and may be discontinuously distributed. The additional metal layer pattern 110c may have various shapes such as "H," "I," "T" and "Y," and the same shape may be repeatedly arranged or different shapes may be repeatedly arranged.

If the additional metal layers 110 are formed on the top and bottom surfaces of the metal-bonded substrate, the entire mass of the additional metal layer 110 formed on the top surface of the metal-bonded substrate may be set to be different from the entire mass of the additional metal layer 110 formed on the bottom surface of the metal-bonded substrate. Preferably, the difference between the entire mass of the additional metal layers 110 formed on the top and bottom surfaces may be between 20% and 80%. That is, preferably the ratio of the entire mass of the additional metal layer 110 formed on one surface of the metal-bonded substrate to the entire mass of the additional metal layer 110 formed on the other surface of the metal-bonded substrate may be between 1:0.2 and 1:0.8.

If the difference between the entire mass of the additional metal layers 110 formed on the top and bottom surfaces of the metal-bonded substrate is less than 20%, the metal-bonded substrate may be fractured. If the difference between the entire mass of theadditional metal layers 110 formed on the top and bottom surfaces of the metal-bonded substrate is more than 80%, the warpage degree of the metal-bonded substrate on which the additional metal layers 110 are formed is similar to that of the metal-bonded substrate on which the additional metal layers 110 are not formed. In this case, the process for forming the additional metal layers 110 becomes meaningless.

If the additional metal layers 110 are formed on the top and bottom surfaces of the metal-bonded substrate, and the metal-bonded substrate on which the additional metal layers 110 are not formed is warped to be upwardly convex, the entire mass of the additional metal layer 110 formed on the top surface of the metal-bonded substrate is set to be more than the entire mass of the additional metal layer 110 formed on the bottom surface of the metal-bonded substrate. That is, as illustrated in FIGS. 1 and 2, the additional metal layer patterns 110c on the additional metal layer 110 formed on the bottom surface of the metal-bonded substrate are formed to be more than the additional metal layer patterns 110c on the additional metal layer 110 formed on the top surface of the metal-bonded substrate.

Contrary to this, if the metal-bonded substrate on which the additional metal layer 110 is not formed is warped to be downwardly convex, the additional metal layer patterns 110c on the additional metal layer 110 formed on the top surface of the metal-bonded substrate should be formed to be more than the additional metal layer patterns 110c on the additional metal layers 110 formed on the bottom surface of the metal-bonded substrate. Due to such a difference in the numbers of the additional metal layer patterns 110c, the entire mass of the additional metal layer 110 formed on the bottom surface of the metal-bonded substrate is more than the entire mass of the additional metal layer 110 formed on the top surface of the metal-bonded substrate.

Figure 4:
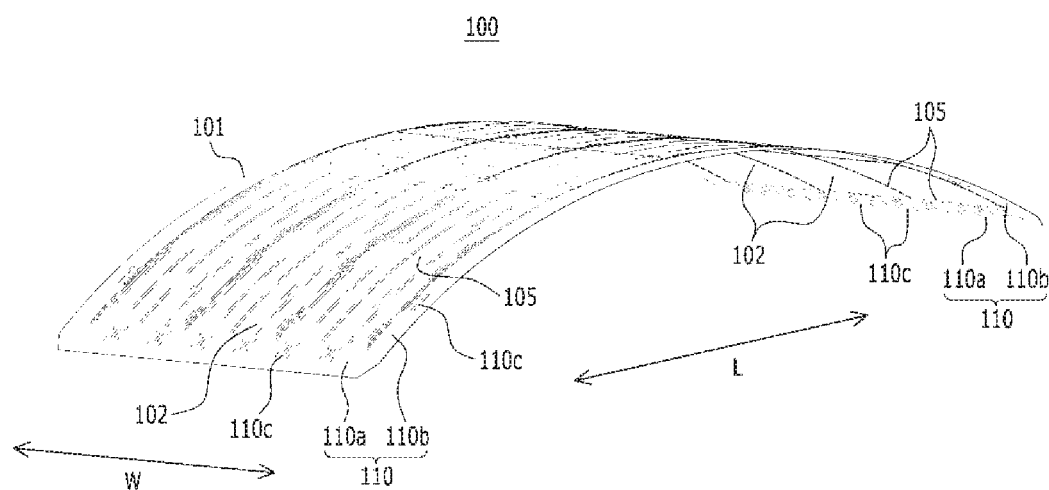
FIG. 4 is a perspective view of the warpage-preventing structure according to the preferred embodiment of the present invention.

The difference in the entire mass of the additional metal layers 110 may be determined on the basis of the warpage direction. As illustrated in FIG. 4, if the metal-bonded substrate on which the additional metal layer 110 is not formed is warped along a length direction L, the additional metal layer patterns 110c on the additional metal layer 110a formed along a width direction W are formed to be more than the additional metal layer patterns 110c on the additional metal layer 110b formed along the length direction L. That is, the entire mass of the additional metal layer 110b formed along the length direction L is set to be more than the entire mass of the additional metal layer 110aformed along the width direction W.

Contrary to this, if the metal-bonded substrate on which the additional metal layer 110 is not formed is warped along the width direction W, the additional metal layer patterns 110c on the additional metal layer 110b formed along the length direction L are formed to be more than the additional metal layer patterns 110c on the additional metal layer 110a formed along the width direction W. That is, the entire mass of the additional metal layer 110a formed along the width direction W is set to be more than the entire mass of the additional metal layer 110b formed along the length direction L.

In summary, the entire mass of the additional metal layer 110 formed in a direction perpendicular to the warpage-progress direction of the metal-bonded substrate is set to be less than the entire mass of the additional metal layer 110 formed in the warpage-progress direction of the metal-bonded substrate. That is, the additional metal layer patterns 110c on the additional metal layer 110 extended in a direction perpendicular to the warpage-progress direction of the metal-bonded substrate are formed to be more than the additional metal layer patterns 110c on the additional metal layer 110 extended in the warpage-progress direction of the metal-bonded substrate.

The warpage-preventing structure 100 according to an embodiment of the present invention may further comprise a cutting line 105. The cutting lines 105 are formed between the metal layers 102, and between the metal layer 102 and the additional metal layer 110 to facilitate separating the metal-bonded substrate into individual substrates.

In order to confirm the warpage characteristics of the metal-bonded substrate including the warpage-preventing structure according to the present invention, metal-bonded ceramic substrates were manufactured and experiments for them were performed. The metal-bonded ceramic substrates were manufactured in a manner wherein the metal layers for circuit pattern 102 and the additional metal layers 110 were formed on a ceramic substrate as follows.

COMPARATIVE EXAMPLE

A metal-bonded ceramic substrate on which additional metal layers were not formed.

EXAMPLE 1

A metal-bonded ceramic substrate which was manufactured in the same manner as the Comparative Example, except that additional metal layer patterns were formed on the additional metal layer which was on the bottom surface of the substrate and extended in a width direction, and had the entire mass of 86% relative to the entire mass of the additional metal layers on the top surface of the substrate.

EXAMPLE 2

A metal-bonded ceramic substrate which was manufactured in the same manner as the Comparative Example, except that additional metal layer patterns were formed on the additional metal layer which was on the bottom surface of the substrate and extended in the width direction, and had the entire mass of 81% relative to the entire mass of the additional metal layers on the top surface of the substrate.

EXAMPLE 3

A metal-bonded ceramic substrate which was manufactured in the same manner as the Comparative Example, except that additional metal layer patterns were formed on the additional metal layer which was on the bottom surface of the substrate and extended in the width direction, and had the entire mass of 63% relative to the entire mass of the additional metal layers on the top surface of the substrate.

EXAMPLE 4

A metal-bonded ceramic substrate which was manufactured in the same manner as the Comparative Example, except that additional metal layer patterns were formed on the additional metal layer which was on the bottom surface of the substrate and extended in the width direction, and had the entire mass of 44% relative to the entire mass of the additional metal layers on the top surface of the substrate.

EXAMPLE 5

A metal-bonded ceramic substrate which was manufactured in the same manner as the Comparative Example, except that additional metal layer patterns were formed on the additional metal layer which was on the bottom surface of the substrate and extended in the width direction, and had the entire mass of 24% relative to the entire mass of the additional metal layers on the top surface of the substrate.

EXAMPLE 6

A metal-bonded ceramic substrate which was manufactured in the same manner as the Comparative Example, except that additional metal layer patterns were formed on the additional metal layer which was on the bottom surface of the substrate and extended in the width direction, and had the entire mass of 0% relative to the entire mass of the additional metal layers on the top surface of the substrate (the additional metal layer, which was on the bottom surface of the substrate and extended in the width direction, was completely removed).

The experimental conditions were as follows.
Heat treatment temperature: 270° C.
Performing one cycle: room temperature for 10 minutes→heated up to 270° C.→cooled→room temperature
Warpage test apparatus: Flatness Measurement and Analysis System, TherMoir Model PS200
Warpage test method: 10 samples for each Example were manufactured, and warpage values were measured and averaged.

Table 1 shows warpage values (μm) of the length direction of the metal-bonded ceramic substrate before heat treatment. Table 2 shows warpage values (μm) of the length direction of the metal-bonded ceramic substrate after heat treatment.

TABLE 1

| | Before heat treatment | | | | | | |
|---|---|---|---|---|---|---|---|
| | Comparative example | Example 1 | Example 2 | Example 3 | Example 4 | Example 5 | Example 6 |
| Entire mass of additional metal layers of top surface | 100% | 100% | 100% | 100% | 100% | 100% | 100% |
| Entire mass of additional metal layers of bottom surface | 100% | 86% | 81% | 63% | 44% | 24% | 0% |
| 1 | 1519 | 1400 | 1294 | 1253 | 1231 | 1188 | 1090 |
| 2 | 1560 | 1344 | 1346 | 1244 | 1280 | 1160 | Fractured |
| 3 | 1513 | 1371 | 1453 | 1410 | 1245 | 1205 | Fractured |
| 4 | 1471 | 1310 | 1207 | 1301 | 1211 | 1250 | 1250 |
| 5 | 1576 | 1014 | 1266 | 1210 | 1270 | 1150 | Fractured |
| 6 | 1372 | 1380 | 1322 | 1200 | 1180 | 1166 | 1160 |
| 7 | 1540 | 1393 | 1257 | 1254 | 1160 | 1260 | 1155 |
| 8 | 1576 | 1258 | 1232 | 1200 | 1210 | 1180 | 1149 |
| 9 | 1208 | 1319 | 1191 | 1311 | 1211 | 1175 | Fractured |
| 10 | 1535 | 1363 | 1427 | 1222 | 1199 | 1210 | 1178 |
| Average | 1487 | 1315.2 | 1299.5 | 1260.5 | 1219.7 | 1194.4 | 1163.667 |

TABLE 2

| | After heat treatment | | | | | | |
|---|---|---|---|---|---|---|---|
| | Comparative Example | Example 1 | Example 2 | Example 3 | Example 4 | Example 5 | Example 6 |
| Entire mass of additional metal layers of top surface | 100% | 100% | 100% | 100% | 100% | 100% | 100% |
| Entire mass of additional metal layers of bottom surface | 100% | 86% | 81% | 63% | 44% | 24% | 0% |
| 1 | 1908 | 1071 | 1309 | 1453 | 1431 | 1388 | 1405 |
| 2 | 1807 | 1510 | 1505 | 1444 | 1399 | 1399 | Fractured |
| 3 | 1676 | 1433 | 1405 | 1478 | 1445 | 1405 | Fractured |
| 4 | 1588 | 1503 | 1421 | 1501 | 1411 | 1410 | 1385 |
| 5 | 1868 | 1543 | 1396 | 1350 | 1470 | 1375 | Fractured |
| 6 | 1657 | 1557 | 1293 | 1400 | 1300 | 1366 | 1360 |
| 7 | 1924 | 1549 | 1305 | 1454 | 1310 | 1420 | 1270 |
| 8 | 1815 | 1466 | 1493 | 1310 | 1410 | 1380 | 1380 |
| 9 | 1594 | 1372 | 1476 | 1511 | 1411 | 1250 | Fractured |
| 10 | 1734 | 1577 | 1472 | 1422 | 1299 | 1410 | 1378 |
| Average | 1757.1 | 1458.1 | 1407.5 | 1432.3 | 1388.6 | 1370.3 | 1363 |

As shown in Tables 1 and 2, the metal-bonded ceramic substrate on which the additional metal layer patterns 110c are not formed (Comparative Example) was warped up to an average of 1757.1 μm after heat treatment, whereas the warpage of the metal-bonded ceramic substrates (Examples 1-6) according to the present invention was reduced. In particular, regarding the ratio of the entire mass of the additional metal layers formed on the top surface to the entire mass of the additional metal layers formed on the bottom surface, the reducing quantity of warpage was remarkably changed at the ratio of 80%, and the boundary between good and failure (fracture) was formed at the ratio of 20%.

Although the particular embodiment of the present invention is explained above, it is noted that modifications and variations could be made by a skilled artisan within the scope and spirit of the present invention.

REFERENCE NUMERALS

100: Warpage-preventing structure
101: Substrate
102: Metal layer for circuit pattern
110: Additional metal layer
110a: Additional metal layer extended in a width direction
110b: Additional metal layer extended in a length direction
110c: Additional metal layer pattern

The invention claimed is:

1. A warpage-preventing structure for preventing warpage of a substrate, wherein at least one metal layer for circuit pattern is disposed on at least one surface of the substrate, the warpage-preventing structure comprising:
   at least one additional metal layer, wherein the at least one additional metal layer is disposed on at least one surface of the substrate and arranged along an edge of the substrate,
   wherein at least one additional metal layer pattern is formed on the at least one additional metal layer by removing at least one predetermined area of the at least one additional metal layer.

2. The warpage-preventing structure of claim 1, wherein the at least one additional metal layer pattern is a plurality of additional metal layer patterns, which are removed to be spaced apart from each other.

3. The warpage-preventing structure of claim 1, wherein the additional metal layers are formed on a first surface and a second surface of the substrate, and
   wherein an entire mass of the additional metal layer formed on the first surface of the substrate is different from an entire mass of the additional metal layer formed on the second surface of the substrate.

4. The warpage-preventing structure of claim 3, wherein a ratio of the entire mass of the additional metal layer formed on the first surface to the entire mass of the additional metal layer formed on the second surface is 1:0.2 to 1:0.8.

5. The warpage-preventing structure of claim 3, wherein for the substrate which is warped in such a way that the first surface of the substrate is convex, and the second surface of the substrate is concave, the entire mass of the additional metal layer formed on the first surface is set to be more than the entire mass of the additional metal layer formed on the second surface.

6. The warpage-preventing structure of claim 1, wherein for the substrate which is warped along a first direction, the entire mass of the additional metal layer formed in the first direction of the substrate is set to be more than the entire mass of the additional metal layer formed in a second direction of the substrate, and
   wherein the second direction is perpendicular to the first direction.

7. The warpage-preventing structure of claim 1, further comprising at least one cutting line which is disposed between the at least one metal layer and the at least one additional metal layer.

* * * * *